(12) United States Patent
Schloesser (10) Patent No.: US 7,476,920 B2
(45) Date of Patent: Jan. 13, 2009

(54) $6F^2$ ACCESS TRANSISTOR ARRANGEMENT AND SEMICONDUCTOR MEMORY DEVICE

(75) Inventor: Till Schloesser, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 578 days.

(21) Appl. No.: 11/011,040

(22) Filed: Dec. 15, 2004

(65) Prior Publication Data

US 2006/0281250 A1 Dec. 14, 2006

(51) Int. Cl.
*H01L 27/108* (2006.01)
*H01L 29/94* (2006.01)

(52) U.S. Cl. ............... 257/296; 257/295; 257/306; 257/329; 257/331; 257/332; 257/333

(58) Field of Classification Search .............. 257/329, 257/331–333, 296, 295, 306
See application file for complete search history.

(56) References Cited

U.S. PATENT DOCUMENTS

| | | | |
|---|---|---|---|
| 5,408,116 A * | 4/1995 | Tanaka et al. ............... | 257/327 |
| 5,463,236 A | 10/1995 | Sakao | |
| 5,502,320 A | 3/1996 | Yamada | |
| 5,798,544 A | 8/1998 | Ohya et al. | |
| 6,545,904 B2 | 4/2003 | Tran | |
| 6,570,208 B2 | 5/2003 | Mandelman et al. | |
| 6,735,132 B2 | 5/2004 | Siek | |
| 6,808,981 B2 | 10/2004 | Mandelman et al. | |
| 7,139,184 B2 | 11/2006 | Schloesser | |
| 7,170,124 B2 * | 1/2007 | Tran et al. ................... | 257/296 |
| 2005/0095794 A1 * | 5/2005 | Park ............................ | 438/296 |

FOREIGN PATENT DOCUMENTS

| | | |
|---|---|---|
| TW | 311285 | 7/1997 |
| WO | 0101469 A1 | 1/2001 |
| WO | WO 01/01489 A1 | 1/2001 |

\* cited by examiner

*Primary Examiner*—Steven Loke
*Assistant Examiner*—Arman Khosraviani
(74) *Attorney, Agent, or Firm*—Edell, Shapiro & Finnan, LLC (57) ABSTRACT

An access transistor arrangement is provided for a $6F^2$ stacked capacitor DRAM memory cell layout with shared bit line contacts. The access transistors are arranged in pairs along semiconductor lines. The two transistors of each pair of transistors are arranged laterally reversed opposing the respective common bit line section. Each pair of access transistors is separated from the adjacent pair of access transistors by an isolation transistor which is permanently turned off. The access transistors and the isolation transistors are formed as identical recessed channel transistors with elongated channel and enhanced isolation properties. The same dopant concentration may be provided for both junctions of the access transistors. As identical devices are provided both as access transistor and as isolation transistors, the complexity of lithographic patterning processes is reduced.

17 Claims, 6 Drawing Sheets

$6F^2$ ACCESS TRANSISTOR ARRANGEMENT AND SEMICONDUCTOR MEMORY DEVICE

FIELD OF THE INVENTION

The present invention relates to $6F^2$ access transistor arrays for semiconductor memory devices having bit lines and storage devices arranged above a pattern surface of a semiconductor substrate. The present invention relates further to a semiconductor memory device with $6F^2$ cell size.

DESCRIPTION OF THE RELATED ART

A semiconductor memory cell typically includes a storage device for storing data and an access device for accessing the data stored in the storage device.

In DRAM memory cells, data is stored by charging or discharging a storage capacitor. In stacked capacitor type DRAM memory cells, the capacitors are placed on top of the access devices. Typically field-effect access transistors (FETs) are provided as access devices.

Active areas of the access transistors are formed in a single crystalline semiconductor substrate. The active area comprises a first doped region defining a first source/drain-region, a second doped region defining a second source/drain-region and a channel region between the first and the second source/drain-region. The first and the second doped region have a first conductivity type. The channel region is not doped or is of a second conductivity type which is the opposite of the first conductivity type.

The first doped region forms a bit line contact section and is coupled to a bit line. The bit line transmits data to and from the memory cell. The second doped region forms a storage node contact section and is connected to a storage node electrode of the capacitor.

According to planar cell concepts, the bit line contact section and the storage node contact section adjoin a pattern surface of the semiconductor substrate.

Each access transistor is controlled by a voltage applied to a gate electrode which is arranged above the pattern surface and adjacent to the respective channel section. A gate dielectric insulates the gate electrode from the channel region. The electric potential of the gate electrode controls by capacitive coupling the charge carrier distribution in the adjoining channel section.

By applying a voltage higher than a threshold voltage to the gate electrode, an enhancement zone of mobile charge carriers forms a conductive channel in the channel section between the storage node contact section and the bit line contact section. The conductive channel connects the storage node electrode of the capacitor to the bit line. Otherwise, the storage node electrode of the capacitor is insulated from the bit line.

Typically, the access transistors are arranged in rows and columns in a periodically repetitive pattern. Rows of memory cells are separated by row insulator lines such that the active areas of access transistors within each row form a semiconductor line between two adjacent row insulator lines.

Within each row of memory cells, insulating devices separate adjacent memory cells. The insulating devices may be formed as column insulator pits, which are made of an insulating material.

The minimum line width or features size that can be obtained for a line in a lithographic pattern process at a specified exposure wave length depends, inter alia, on the pattern which is exposed. Whereas in case of repetitive line patterns having a width/pitch ratio of about 1:2 interference patterns caused by diffraction may superpose advantageously, this does not apply to isolated or single line patterns.

As both the row insulator lines and the semiconductor lines may have the same line width and as the pattern of semiconductor lines and row insulator lines repeats periodically with a pitch of the double line width, the width/pitch ratio is about 1:2. To obtain high packaging densities, the line width of the structures is set to the minimum feature size F that can be achieved by the respective photolithographic patterning process for periodical striped-shaped line patterns at a width/pitch ratio of 1:2.

In the case of the column insulator pits, the width of the pits should be substantially smaller than the length of the section of the semiconductor lines between two neighboring column insulator pits. To achieve a minimum cell size, the width of the pits, which emerge from a lithographic pattern process, should be F. The length of two adjacent active areas with shared bit line contact sections results from the requirement of two separated stripe shaped crossing word lines and from the requirement that the bit line contact sections and the node contact sections should be accessible from above the word lines.

Typically, the length of two joined active areas is at least 5*F. The resulting width/pitch ratio is 1:6. The corresponding lithographic mask pattern is more similar to that of a single line pattern than to the above mentioned exposure friendly stripe-shaped pattern.

Thus the formation of the column insulator pits within the semiconductor lines requires a more complex lithographic patterning process than the formation of the row insulating lines.

In German Patent No. DE 199 28 781 C1, the disclosure of which is incorporated herein by reference, a stacked capacitor that shares bit line contact layout with recess channel array transistors (RCATs) and buried word lines is disclosed. The word lines are completely buried in trenches which are formed in a substrate. Each two word line trenches alternate with one insulator trench.

U.S. Pat. No. 5,502,320, the disclosure of which is incorporated herein by reference, refers to semiconductor memory devices with partly buried capacitors and completely buried word lines.

U.S. Pat. No. 6,545,904, the disclosure of which is incorporated herein by reference, discloses an isolation field effect transistor structure for access transistor arrangements. The isolation field effect transistor is arranged as an insulating device between neighboring memory cells within the rows of memory cells in lieu of the column insulation pit. The isolation transistor device is controlled by an isolation gate line. By applying a suitable bias voltage to the isolation gate line, mobile charge carriers are depleted in a depletion zone in the section of the semiconductor substrate adjacent to the isolation gate line. The isolation transistor is permanently switched off and in the non-conducting state.

Compared to insulating pits, conventional isolation transistors suffer from a higher leakage current to the storage node, such that the storage device is gradually discharged and a high repetition rate of a refresh cycle is necessary to restore data.

Lowering gate induced leakage current by providing the isolation transistor with a gate dielectric that is thicker than that of the access transistors results in at least one additional lithographic pattern process. Due to the occurrence of short channel effects, for example excessive sub-threshold leakage current, planar isolation transistors do not scale down well to sub 100 nanometer technologies with a minimum feature size of photolithographic patterns of less than 100 nanometers.

Therefore, a need exists for an access transistor arrangement which makes feasible a $6F^2$ layout with reduced leakage currents, which scales down to sub 100 nanometer technologies, and which requires less process complexity for the necessary patterning processes.

SUMMARY

In one aspect, the present invention provides an access transistor array comprising a semiconductor substrate, a first and a second access transistor and an isolation transistor. Each access transistor has a gate electrode and an active area, wherein the active area is formed within the semiconductor substrate and comprises a bit line contact section, a node contact section and a channel section. The bit line contact section and the node contact section adjoin a pattern surface of the substrate. The channel section separates the bit line contact section from the node contact section. Each gate electrode is disposed in parts over the pattern surface and in parts in recess grooves. The recess grooves are formed in the substrate between the node contact sections and the respective bit line contact sections. Each gate electrode is separated from the respective channel section by a gate dielectric.

The isolation transistor is arranged between the first and the second access transistor. The first and the second access transistors face laterally reversed opposing the isolation transistor, wherein the node contact section of the first access transistor and the node contact section of the second access transistor are adjacent to the isolation transistor.

The isolation transistor is controlled by an isolation gate line. The isolation gate line is disposed in part over the pattern surface and in part in an isolation groove formed in the substrate between the node contact sections of the first and the second access transistor and is separated from the substrate by an isolation gate dielectric.

Thus, access transistors and isolation transistor are formed as recessed channel transistors with enhanced insulation properties. Providing identical recess channel devices having enhanced isolation properties for both the access transistors and the isolation transistor eliminates the need for different processing of the transistor devices and reduces pattern process complexity. Only stripe-shaped masks with repetitive line patterns having a width/pitch ratio of about 1:2 are required facilitating a true $6F^2$ cell size for high packaging densities. Low dopant concentrations both for node contact sections and bit line contact sections of the access transistors become feasible resulting in further reduced node junction leakage current and reduced process complexity.

In a second aspect, the present invention provides a semiconductor memory device comprising a semiconductor substrate, a first and a second access transistor, an isolation transistor, storage capacitors and a bit line.

Each access transistor has a gate electrode and an active area. The active area is formed within the semiconductor substrate and comprises a bit line contact section, a node contact section and a channel section. The bit line contact section and the node contact section adjoin a pattern surface of the substrate. The channel section separates the bit line contact section from the node contact section. Each gate electrode is disposed at least in part in recess grooves. The recess grooves are formed in the substrate between the node contact sections and the respective bit line contact sections. Each gate electrode is separated from the respective channel section by a gate dielectric.

The node contact section of each access transistor is coupled to a storage capacitor that is disposed over the pattern surface. Each bit line contact section is coupled to the bit line.

The isolation transistor is arranged between the first and the second access transistor. The first and the second access transistors face laterally reversed opposing the isolation transistor, wherein the node contact section of the first access transistor and the node contact section of the second access transistor are adjacent to the isolation transistor.

The isolation transistor is controlled by an isolation gate line. The isolation gate line is disposed at least in part in an isolation groove formed in the substrate between the node contact sections of the first and the second access transistor and is separated from the substrate by an isolation gate dielectric.

These and other objects, features and advantages of the present invention will become apparent from the following detailed description of illustrative embodiments thereof, which is to be read in connection with the accompanying drawings.

BRIEF DESCRIPTION OF DRAWINGS

The disclosure will present in detail the following description of referred embodiments with reference to the following figures, wherein.

Corresponding numerals in the different figures refer to corresponding parts and structures unless otherwise indicated. The figures are drawn to clearly illustrate the relevant aspects of the preferred embodiments and are not necessarily in all respects drawn to scale.

DETAILED DESCRIPTION OF PREFERRED EMBODIMENTS

Figure 1:
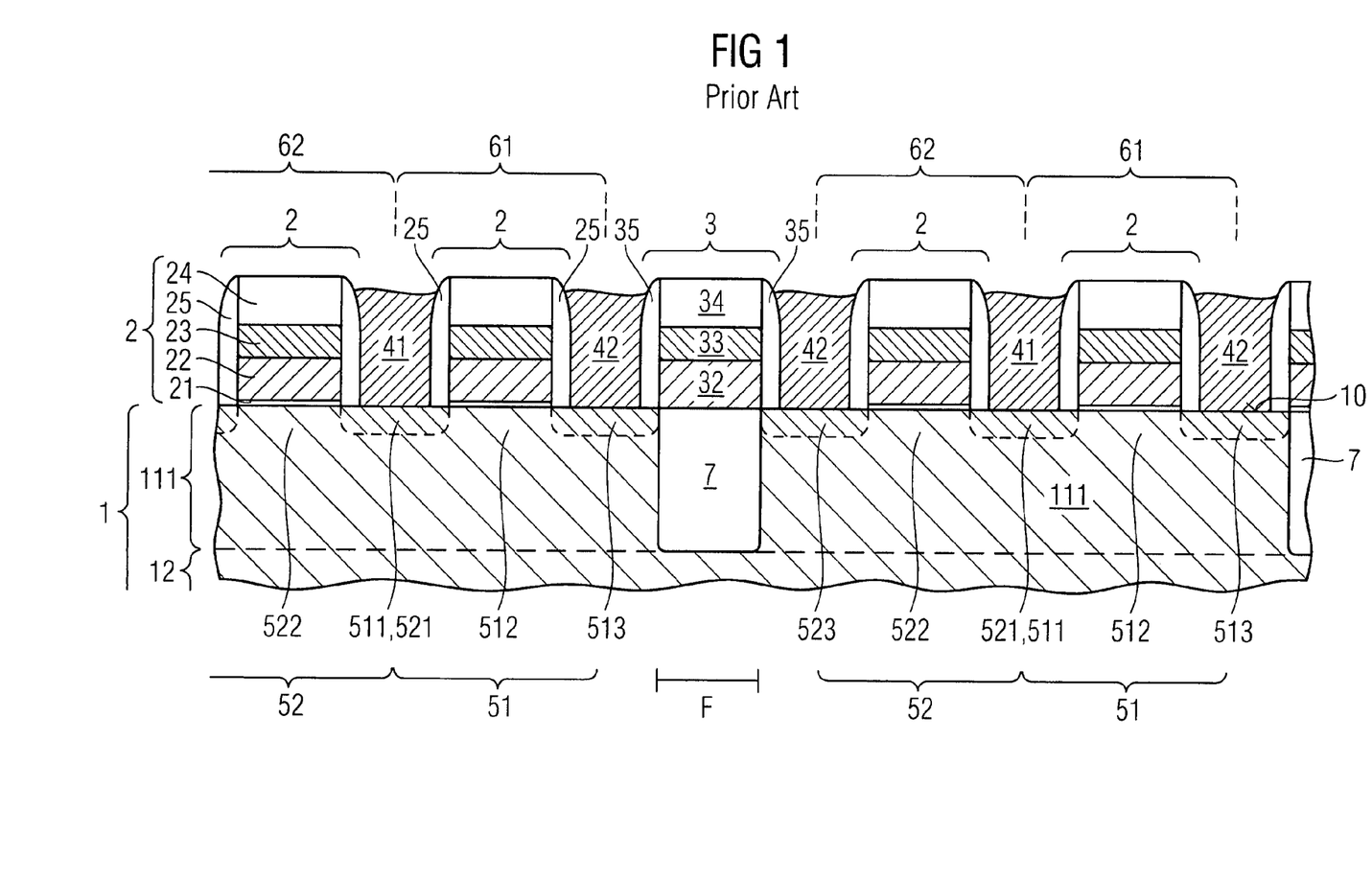
FIG. 1 illustrates a cross-sectional view of an access transistor array in a shared bit line contact layout in accordance with prior art.
Figure 5:
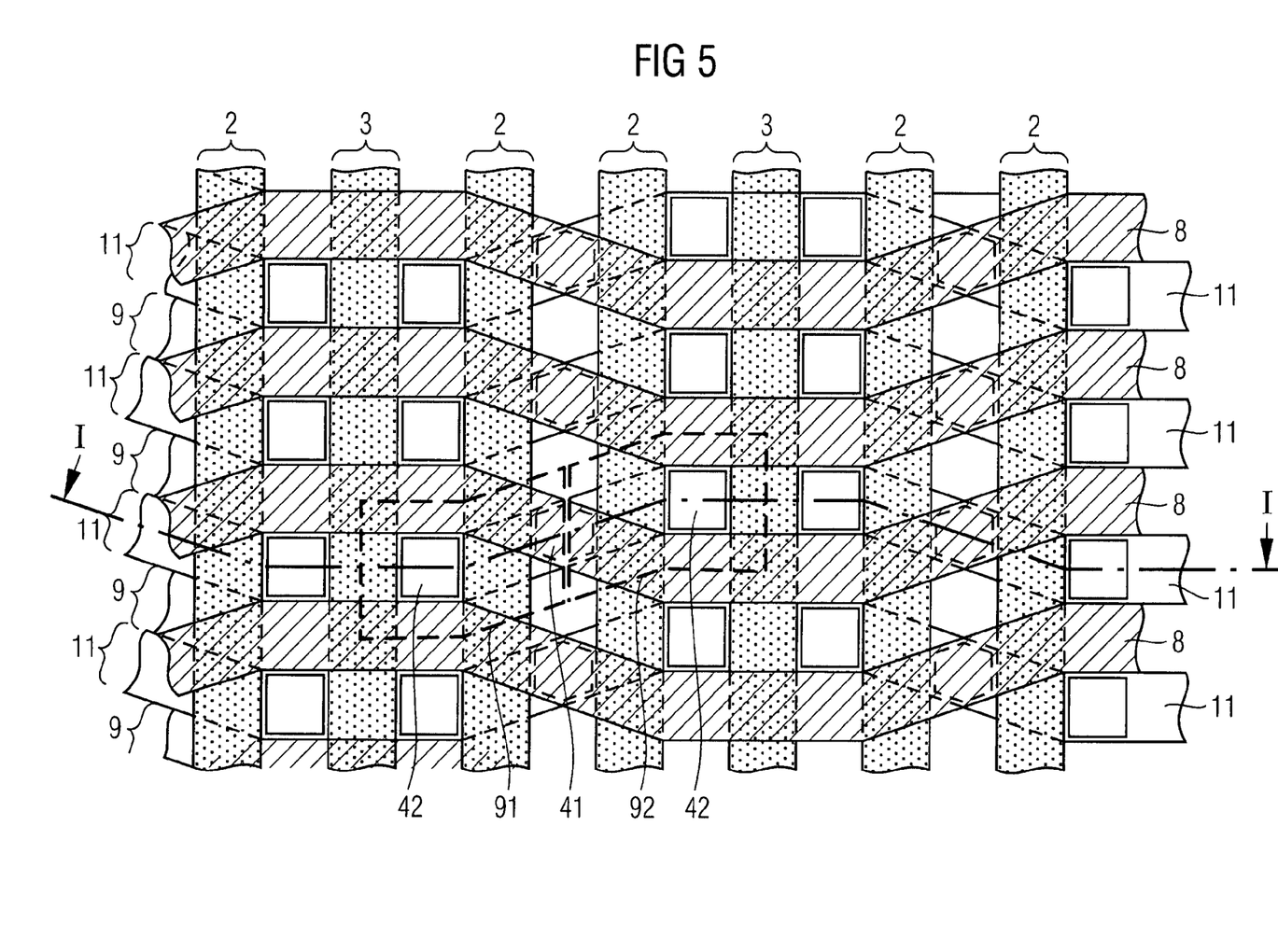
FIG. 5 is a simplified plan view of a memory cell array in a shared bit line contact layout and with serpentine path bit lines in accordance with embodiments of the present invention.

FIG. 1 is a cross-sectional view along cut-line I-I of FIG. 5 and illustrates an access transistor arrangement according to prior art.

The cut line of the cross-sectional view of FIG. 1 runs along a serpentine line of semiconductor fins 111 extending outwardly from a bulk section 12 of a semiconductor substrate 1. In two parallel planes in front of and behind the cut plane, the semiconductor fins 111 are confined by row insulator lines 9.

Each semiconductor fin 111 comprises the active areas 51, 52 of two access transistors 61, 62. The semiconductor fins 111 are lined up along a meandering line according to FIG. 5. Each active area 51, 52 comprises a bit line contact section 511, 521, a node contact section 513, 523 and a channel section 512, 522, which separates the node contact section 513, 523 from the respective bit line contact section 511, 521. The two transistors 61, 62 of each pair of access transistors 61, 62 are arranged mirror-inverted and share a common bit line contact section 511, 521. The bit line contact sections 511, 521, the node contact sections 513, 523 and the channel sections 512, 522 adjoin a pattern surface 10 of the semiconductor substrate 1.

For a line width smaller than 120 nanometers, the bit line contact sections 511, 521 are provided heavily doped whereas the node contact sections 513, 523 are formed lightly doped to avoid short channel effects and high leakage currents in the non-conducting state of the access device.

Word lines 2 extend perpendicular to the cut line. The word lines 2 cross the rows of semiconductor fins 111 above the channel sections 512, 522. In the intersection areas of word lines 2 and channel sections 512, 522 the respective word line 2 is effective as a gate electrode which controls the distribution of mobile charge carriers within the respective channel section 512, 522. A gate dielectric 21 insulates a semiconductor layer 22 of word lines 2 from channel sections 512, 522. A high conductivity layer 23 is disposed on top of the semiconductor layer 22. The word lines 2 comprise further an insulating layer 24 covering the respective high conductivity layer 23 and insulating spacers 25 which cover vertical sidewalls of the semiconductor layer 22, the high conductivity layer 23 and the insulating layer 24.

In the center of FIG. 1 a column insulator pit 7 is arranged as insulating device. An isolation gate line 3 is arranged above the column insulator pit 7 between a first access transistor 61 on the left hand and a second access transistor 62 on the right hand. The first access transistor 61 and the second access 62 transistor are arranged mirror-inverted with the respective node contact sections 513, 523 adjoining the column insulator pit 7.

The isolation gate lines 3 are formed to ease a lithographic process for patterning the word lines 2 and emerge from the same patterning process as word lines 2. Accordingly, each isolation gate line 3 comprises a semiconductor layer 32, a high conductivity layer 33, an insulating layer 34 and insulating spacers 35. Word lines 2 and isolation gate lines 3 are formed simultaneously from the same layer stack and are summarized under the term gate conductor lines in the following.

The pattern periodicity pitch along a column direction which is perpendicular to the cut line of FIG. 1 is twice the width of the semiconductor fins 111 and determines a minimum feature size FC of the cell layout in column direction.

The same applies to the pitch of gate conductor lines 2, 3, such that a minimum feature size FRGC in a row direction for the gate conductor lines 2, 3 is equivalent to FC.

Referring to the patterning of column insulator pits 7, a further stripe-shaped etch mask is required, wherein the width/pitch ratio should be 1:6 for high density packaging. Substantially more patterning process complexity is required to suppress interference effects like side lobe printing.

Another insulation device is proposed therefore in the prior art to avoid the requirement of a stripe-shaped etch mask with a minimum line width of FC and a pitch periodicity of 6*FC. In lieu of the column insulation pits 7, an insulating gate dielectric 31 is formed between the insulating semiconductor layer 32 and the pattern surface 10 of semiconductor substrate 1, such that an isolation transistor is formed in the semiconductor substrate 1, with the node contact sections 513, 523 of the adjacent access transistors 61, 62 as a first and a second insulating source/drain-junction and an isolation area 50 between the first and the second insulating source/drain-junction.

The mobile charge carrier distribution in the isolation area is controlled by a support potential applied to the isolation gate line 3. During operation of the access transistor arrangement, the support potential is selected such that the isolation transistor is permanently turned off.

When scaling down the access transistor to a shorter channel length the edges of depletion zones on the bit contact and on the node contact side of the channel section get closer together, and a sub-threshold leakage current from the storage node to the bit line through the channel section increases.

The width of the depletion zones is reduced by increasing the dopant concentration in both the channel section and the junction section.

A heavier doped node contact side, on the other hand, results in an increased leakage current between the junction on the node contact side and the substrate. Thus, dopant concentration is usually increased only on the bit line contact side. Therefore, access transistors with short channels are usually asymmetrical in view of the dopant concentration in the channel section and in the junction sections.

As both source/drain-junctions of the isolation transistor are node contact sections of access transistors, both source/drain-junctions are lightly doped. The isolation area separating the source/drain-junctions of the isolation transistor is doped according to the node side of the channel section of the access transistor. With decreasing channel length, the edges of the depletion zones of the isolation transistor get closer together and the sub-threshold leakage current between the junctions through the isolation area increases.

The isolation properties of the isolation transistor are therefore worse than that of the access transistors.

Figure 2:
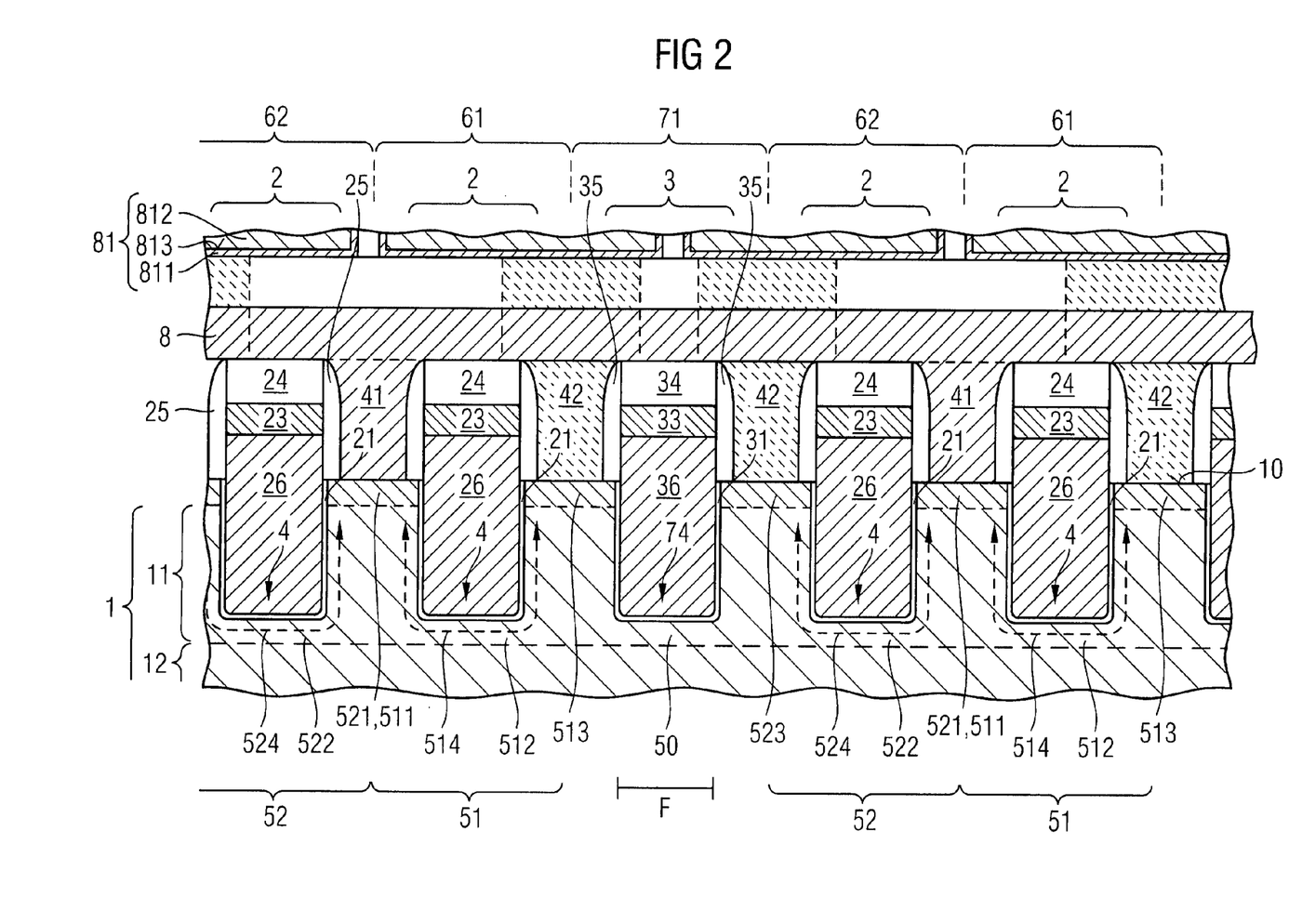
FIG. 2 illustrates a cross-sectional view of an access transistor array in a shared bit line contact layout in accordance with a first embodiment of the present invention with recess channel devices.
Figure 4:
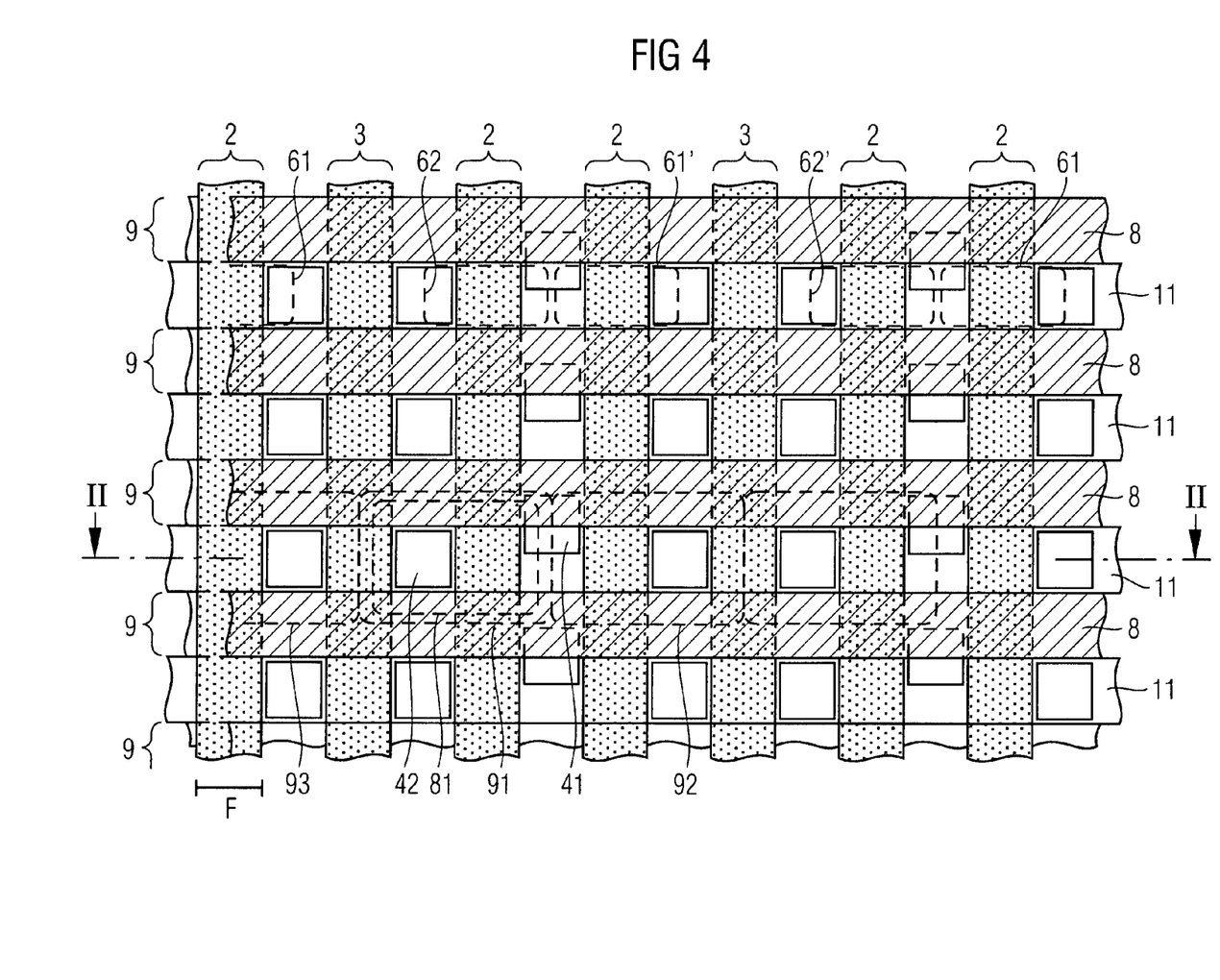
FIG. 4 is a simplified plan view of a memory cell array in a shared bit line contact layout and with straight bit lines in accordance with embodiments of the present invention.

FIG. 2 is a cross-sectional view of an access transistor arrangement along cut line II of FIG. 4 according to a first embodiment of the inventive access transistor arrangement.

The cut line of the cross-sectional view of FIG. 2 runs along a straight semiconductor line 11 extending outwardly from a bulk section 12 of a semiconductor substrate 1 which preferably consists of a single crystalline semiconductor, such as single crystalline silicon. In two parallel planes in front of and behind the cut plane the semiconductor lines 11 are confined by row insulator lines 9. The arrangement of the row insulator lines 9 follows from the corresponding plane view according to FIG. 4.

Each semiconductor line 11 comprises the active areas 51, 52 of pairs of access transistors 61, 62. Each active area 51, 52 comprises a bit line contact section 511, 521 and a node contact section 513, 523, wherein both the bit line contact section 511, 521 and the node contact section 513, 523 adjoin the pattern surface 10. The bit line contact sections 511, 521 and the node contact sections 513, 523 are formed as shallow n-doped layers and with a lower edge substantially parallel to the pattern surface 10.

Between each bit line contact section 511, 521 and the respective node contact section 513, 523, a recess groove 4 is formed in the respective active area 51, 52. Each recess groove 4 extends inwardly from the pattern surface 10 down to a depth less than the depth of the row insulator lines 9. Portions of active areas 51, 52 adjoining the recess grooves 4 form intrinsic or p-doped channel regions 512, 522, which extend between the bit line contact section 511, 521 and the node contact section 513, 523 of the respective active area 51, 52.

The access transistors 61, 62 are arranged in pairs. The active areas 51, 52 of each pair of access transistors 61, 62 are formed mirror-inverted and share a common bit line contact section 511, 521.

Word lines 2 extend perpendicular to the cut line. The word lines 2 cross the rows of semiconductor lines 11 above the recess grooves 4. A gate dielectric 21, preferably of silicon dioxide, insulates a semiconductor layer 26 of the partly buried word lines 2 from the channel sections 512, 522. The semiconductor layer 26 consists preferably of doped polycrystalline silicon. A buried first portion of each word line 2 fills completely the respective recess groove 4. Second portions of word lines 2 are disposed above the pattern surface 10 of substrate 1. That is, semiconductor layer 26 of each word line 2 fills the respective recess groove 4 and extends upward beyond groove 4 to protrude above the pattern surface 10 of substrate 1.

A high conductivity layer 23 is disposed on top of semiconductor layer 26 to reduce line resistance. The high conductivity layer 23 comprises at least one layer consisting of a metal or a metal compound. The word lines 2 comprise further an insulating layer 24 covering the respective high conductivity layer 23 and insulating spacers 25 which cover vertical sidewalls of the semiconductor layer 26, the high conductivity layer 23 and the insulating layer 24. The insulating layer 23 and the insulating spacers 24 preferably consist of silicon nitride. Each portion of a word line 2 that fills a recess groove 4 in the intersection area of the word line 2 and the channel section 512, 522 is effective as a gate electrode which controls by capacitive coupling the distribution of mobile charge carriers within the adjoining channel section 512, 522.

Thus each access transistor is a recessed channel array transistor (RCAT). In the conducting state of the respective access transistor 61, 62 a curved conductive channel 514, 524 is formed in the respective channel section 512, 522 along the edges of recess grooves 4. Due to the longer conductive channel 514, 524, the isolation properties of recessed channel devices are enhanced compared to planar devices of the same planar scale.

On top of bit line contact sections 511, 521 bit contacts 41 are disposed. The bit line contacts 41 consist of heavily doped polycrystalline silicon, of a metal or of a metal compound. Each bit line contact 41 is coupled to a bit line 8 that is disposed on top of the bit line contacts 41.

Node contacts 42 are formed on top of node contact sections 513, 523. The node contacts 42 consist of heavily doped polycrystalline silicon, of a metal or of a metal compound. Each node contact 42 is coupled to a storage electrode 811 of a storage capacitor 81 which is disposed completely above the word lines 2 and over the bit lines 8. A capacitor dielectric 812 separates the storage electrode 811 from a reference electrode 813.

In the center of FIG. 2 an isolation transistor 71 is formed between a first access transistor 61 on the left hand and a second access transistor 62 on the right hand. The first 61 and the second access transistor 62 are arranged mirror-inverted with the respective node contact sections 513, 523 adjacent to the isolation transistor 71, such that the node contact sections 513, 523 of the adjacent access transistors 61, 62 form a first and a second insulating source/drain-junction of the isolation transistor 71.

An isolation groove 74 extends inwardly from the pattern surface 10 of substrate 1 to preferably the depth of the recess grooves 4. An isolation gate dielectric 31 is disposed on those sidewalls of the isolation grooves 74 which are formed by the semiconductor substrate 1. The isolation gate dielectric 31 consists preferably of the material of the gate dielectric 21 of the access transistors 61, 62, for example a silicon oxide, and has preferably the same thickness as gate dielectric 21.

Each isolation gate line 3 is in part buried and in part disposed above the pattern surface 10 and comprises a semiconductor layer 36, a high conductivity layer 33, an insulating layer 34 and insulating spacers 35. Word lines 2 and isolation gate lines 3 are formed simultaneously from the same layer stack and are summarized under the term gate conductor lines in the following. Providing the gate conductor lines 2, 3 at least in part above pattern surface 10 simplifies adjusting of bit line and node contacts 41, 42 to the respective bit line contact sections 511, 521 and node contact sections 513, 523 and simplifies further the formation of high conductivity layers 23, 33 of the gate conductor lines 2, 3.

An isolation area 50 separates the first and the second insulating source/drain-junction of the isolation transistor 71. The mobile charge carrier distribution in the isolation area 50 is controlled by a support potential applied to an isolation gate line 3. During operation of the access transistor arrangement, the support potential is set such that the isolation transistor 71 is permanently turned off.

The isolation transistor 71 may be formed simultaneously with the access transistors 61, 62 and in the same way as the access transistors 61, 62, at least as far as the critical photolithographic pattern processes are concerned that determine the minimum cell size.

In a preferred embodiment a turn-off voltage applied to the isolation gate is equal to a voltage being applied to the gate electrodes, when the access transistors are turned off.

The width/pitch ratio for patterning both the grooves 4, 74 and the gate conductor lines 2, 3 is about 1:2. The minimum feature size FR that results in row direction is equivalent to the minimum feature size FC that can be achieved in column direction. Simultaneously patterning process complexity is decreased.

Another advantage of the inventive access transistor arrangement results from the enhanced insulating properties of both the access transistor and the isolation transistor compared to prior art devices due to the greater distance between the bit line contact section 511, 521 and the respective node contact section 513, 523.

Due to the longer channel 514, 524 and the wider distance between the depletion zones sub-threshold leakage current is suppressed sufficiently even with lightly doped node and bit contact sides. A low dopant concentration for both the node contact sections 513, 523 and the bit line contact sections 511, 521 of the access transistors 61, 62 results in reduced node junction leakage current to the substrate 1, in improved isolation properties of the isolation transistor 71 and in further decreased process complexity.

Figure 3:
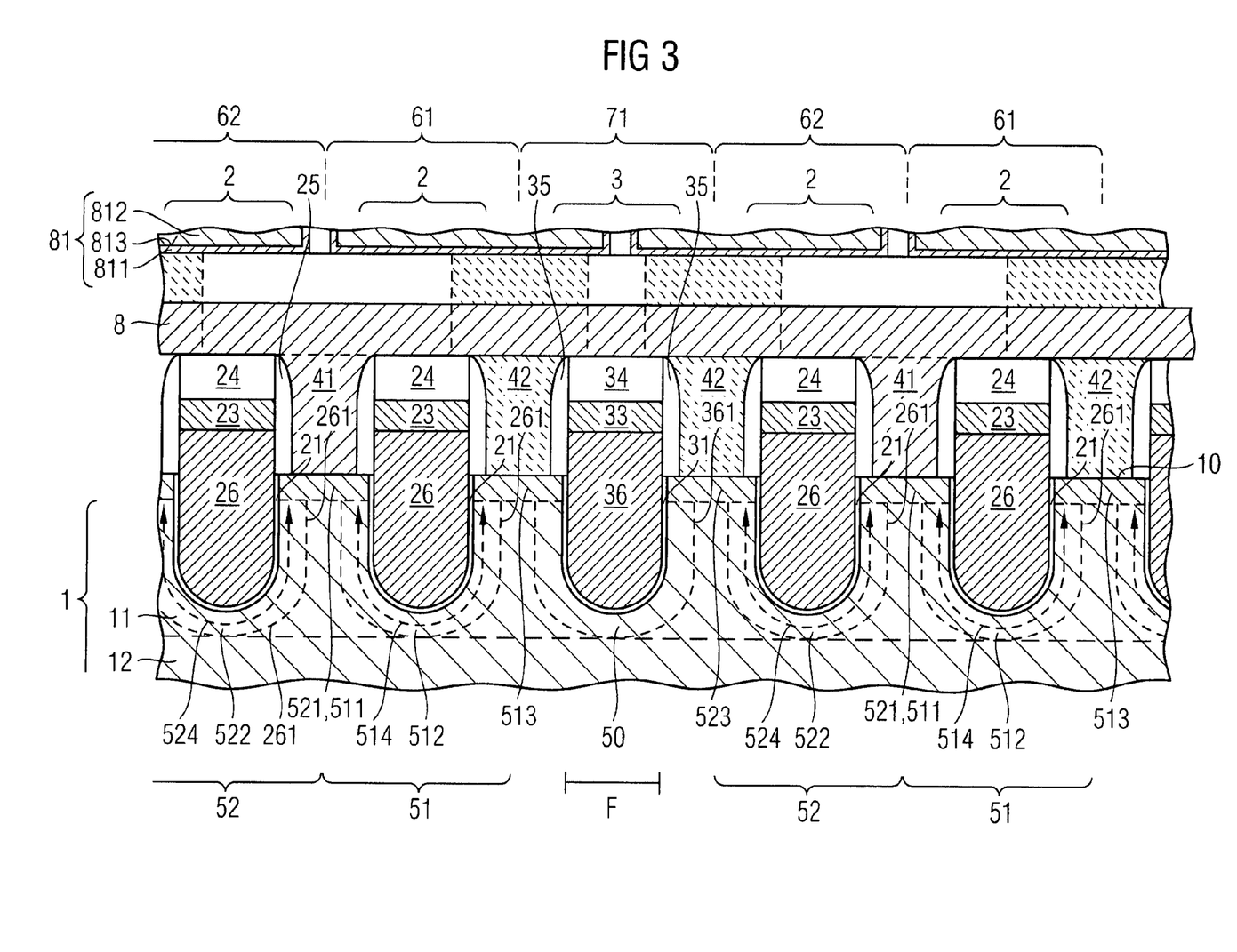
FIG. 3 illustrates a cross-sectional view of an access transistor array in a shared bit line contact layout in accordance with a second embodiment of the present invention with U-grooved devices.

FIG. 3 is a cross-sectional view of an access transistor arrangement along cut line II of FIG. 4 according to a second embodiment of the inventive access transistor arrangement.

The grooves 4, 74 of both the isolation 71 and the access transistors 61, 62 are formed U-shaped. With U-shaped grooves 4, 74, corner effects may be avoided, which may deteriorate the electrical properties of the transistors 61, 62, 71 as well as device reliability.

In other embodiments the partly buried semiconductor layers 26, 36 of the gate conductor lines 2, 3 may have extensions 261, 361 adjoining confining sections of the sidewalls of the active areas 51, such that charge carrier distribution in the channel sections 512, 522 as well as in the isolation areas 50 are controlled in a FinFET-like manner.

FIG. 4 is a simplified plan view of a section of an access transistor array in a shared bit line layout with straight semiconductor lines 11. The semiconductor lines 11 comprise active areas 51, 52. For clarity and ease of understanding the illustration of the active areas 51, 52 is omitted in the plan views. Row insulator lines 9 separate neighboring semiconductor lines 11.

Along each semiconductor line 11 a row of access transistors 61, 62 is formed. The access transistors 61, 62 are arranged in pairs, wherein the access transistors 61, 62 of each pair are arranged laterally reversed opposed a shared bit line contact section. The pairs of access transistor 61, 62 are arranged in series, wherein two pairs of access transistors 61, 62 are separated by isolation transistors (not shown). The isolation transistors are formed in the intersection areas of isolation gate lines 3 and semiconductor lines 11.

A plurality of semiconductor lines 11 is arranged in parallel rows. The isolation transistors are disposed in columns extending perpendicularly to the rows of semiconductor lines 11. Each column of isolation transistors is controlled by one of the isolation gate lines 3. Each isolation gate line 3 connects isolation gate structures of columns of isolation transistors.

Word lines 2 extend parallel to the isolation gate line 3 and cross the semiconductor lines 11 above the recess grooves 4 between a node contact section 513, 523 and a bit line contact section 511, 521 of the respective access transistor 61, 62.

The word lines 2 and the isolation gate lines 3 are illustrated as stippled areas crossing the semiconductor lines 11 orthogonally.

Adjacent memory cells 91, 92 are highlighted. A first memory cell 91 comprises a portion of a semiconductor line 11 between the middle of a bit line contact 41, the bit line contact 41 being shared with the adjacent memory cell 92 on the right hand and the middle of an isolation transistor, the isolation transistor being shared with the adjacent memory cell 93 on the left hand. Each memory cell 91, 92, 93 comprises further portions of the adjacent row insulator lines 9.

The width of both the word lines 2, the gate isolation line 3, the semiconductor line 11 and the row insulator lines is 1*F, such that memory cells 91, 92, 93 require a $6F^2$ area respectively.

On top of the node contact sections 513, 523 node contacts 42 are disposed. Each node contact 42 couples the respective access transistor 61, 62 to a respective storage device 81.

On top of the bit line contact sections 511, 521 bit line contacts 41 are disposed. Each bit line contact 41 couples the respective access transistor 61, 62 to a bit line 3.

The bit lines 3 extend parallel along the semiconductor lines 11 and are disposed between the semiconductor lines 11 on top of row insulator lines 9 for to ease the placement of node contacts 42.

Each storage device 81 is arranged on top of the respective node contact 42 above the bit lines 8.

The bit line contacts 41 are displaced from the semiconductor lines 11 by 0.5*F to make a connection to the respective bit line 3 feasible, wherein the respective bit line 3 runs between the respective semiconductor lines 11 and a neighboring semiconductor line 11.

Another layout within the scope of invention is illustrated in FIG. 5. Within each row of access transistor 61, 62, the storage node contact sections 513, 523 of first pairs of access transistors 61, 62 are lined up in first straight sections of the semiconductor line 11 and the storage nodes 513, 523 of second pairs of access transistors 61, 62 are lined up in second straight sections of the semiconductor line 11. First straight sections and second straight sections alternate respectively. The second sections are displaced from the first sections by 1 F, resulting in a serpentine path semiconductor line 11 with oblique sections between the first and the second straight sections. The oblique sections comprise the shared bit line contact sections 511, 521.

The respective bit line 3 is plaited in the opposite direction, running beside the straight sections and crossing the associated semiconductor line 11 in the oblique sections thereby making feasible both straight node contacts 41 and bit line contacts 42.

Figure 6:
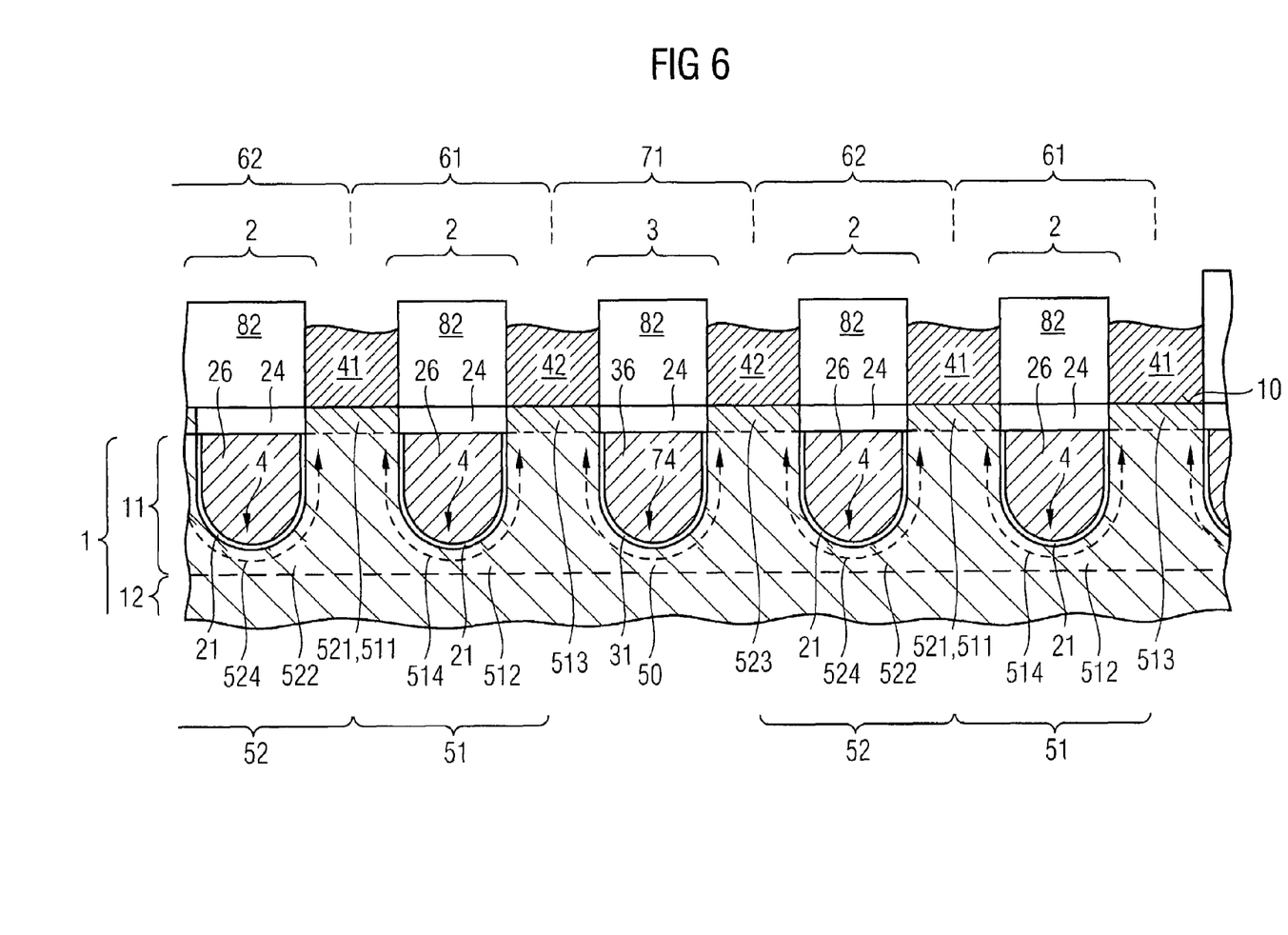
FIG. 6 illustrates a cross-sectional view of an access transistor array in a shared bit line contact layout with completely buried word lines in accordance with a further embodiment of the present invention.

The access transistor arrangement as illustrated in the cross-sectional view of FIG. 6 differs from that of FIG. 2 in that the gate conductor lines 2, 3 are buried completely in the respective grooves 4, 74. The insulating layers 24, 34 are arranged on top of the respective semiconductor layer 26, 36 within the grooves 4, 74 such that an overlap between the semiconductor layer 26, 36 and the source/drain-junctions 511, 513 is avoided.

On top of semiconductor substrate 1 an interlayer dielectric 82 is disposed which insulates node contacts 42 and bit line contacts 41.

Having described preferred embodiments of new and improved access transistor arrangement and semiconductor memory device, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. An integrated circuit, comprising:
   a first access transistor, a second access transistor, a third access transistor, and a fourth access transistor, each access transistor comprising a gate electrode and an active area, each active area being formed in a substrate and adjacent to a pattern surface of the substrate, each gate electrode being disposed at least in part in a recess groove that is formed in the active area between a respective node contact section and a respective bit line contact section formed within the respective active area, the third access transistor being arranged adjacent to the second access transistor such that the bit line contact sections of the second and third access transistors form a common bit line contact section and such that the active areas of the second and third access transistors form a contiguous semiconductor line;
   an isolation transistor arranged between the first and the second access transistors, the first and the second access transistors facing laterally reversed and opposing the isolation transistor, the node contact sections of the first and second access transistors being adjacent to the isolation transistor; and
   a further isolation transistor arranged between the third and the fourth access transistors, the third and fourth access transistors facing laterally reversed and opposing the further isolation transistor, the node contact sections of the third and fourth access transistors being adjacent to the further isolation transistor;
   wherein the isolation transistors are controllable by isolation gate lines, each isolation gate line being disposed at least in part in an isolation groove and being separated from the substrate by an isolation gate dielectric, the isolation groove being formed in the substrate between the node contact sections of the first and the second access transistors and between the node contact sections of the third and the fourth access transistors.

2. The integrated circuit of claim 1, wherein the recess grooves of the access transistors and the isolation groove have the same shape.

3. The integrated circuit of claim 2, wherein the recess grooves of the access transistors and the isolation groove have the same size.

4. The integrated circuit of claim 1, wherein the recess grooves and the isolation groove are U-shaped.

5. The integrated circuit of claim 1, wherein a turn-off voltage applied to the isolation gate is equal to a voltage applied to the gate electrodes to turn off the access transistors.

6. The integrated circuit of claim 1, wherein the node contact sections and the bit line contact sections are formed as doped regions of a first conductivity type;
   channel regions separating the node contact sections and the bit line contact sections in each active area are formed as intrinsic regions or as doped regions of a second conductivity type, wherein the second conductivity type is the opposite of the first conductivity type, and wherein
   the node contact sections and the bit line contact sections have the same dopant concentration.

7. The integrated circuit of claim 1, further comprising further semiconductor lines, the semiconductor lines being separated by row insulating lines, wherein the gate electrodes are sections of word lines, and wherein the word lines extend perpendicularly to the semiconductor lines.

8. A semiconductor memory device, comprising:
a first access transistor, a second access transistor, a third access transistor, and a fourth access transistor, each access transistor comprising a gate electrode and an active area, the active area being formed within a semiconductor substrate;
each active area comprising a bit line contact section, a node contact section and a channel section, the bit line contact section and the node contact section being adjacent to a pattern surface of the substrate, and the channel section separating the bit line contact section and the node contact section; and
each gate electrode being disposed at least in parts in a recess groove formed in the substrate between the respective node contact section and the respective bit line contact section and each gate electrode being separated from the respective channel section by a gate dielectric, the third access transistor being arranged adjacent to the second access transistor such that the bit line contact sections of the second and third access transistors form a common bit line contact section and such that the active areas of the second and third access transistors form a contiguous semiconductor line;
the semiconductor memory device further comprising:
storage capacitors being disposed above the pattern surface, each storage capacitor being coupled to one of the node contact sections;
a bit line, the bit line being coupled to the bit line contact sections; and
an isolation transistor being arranged between the first and the second access transistors, the first and the second access transistors facing laterally reversed and opposing the isolation transistor, the node contact sections of the first and second access transistors being adjacent to the isolation transistor;
a further isolation transistor arranged between the third and the fourth access transistors, the third and fourth access transistors facing laterally reversed and opposing the further isolation transistor, the node contact sections of the third and fourth access transistors being adjacent to the further isolation transistor;
wherein the isolation transistors are controllable by isolation gate lines, each isolation gate line being disposed at least in part in an isolation groove formed in the substrate between the node contact sections of the first and the second access transistors and between the node contact sections of the third and the fourth access transistors and being separated from the substrate by an isolation gate dielectric.

9. The semiconductor memory device of claim 8, wherein the recess grooves of the access transistors and the isolation groove have the same shape.

10. The semiconductor memory device of claim 9, wherein the recess grooves of the access transistors and the isolation groove have the same size.

11. The semiconductor memory device of claim 8, wherein the recess grooves and the isolation groove are U-shaped.

12. The semiconductor memory device of claim 8, wherein a turn-off voltage applied to the isolation gate is equal to a voltage being applied to the gate electrodes to turn off the access transistors.

13. An integrated circuit comprising a semiconductor memory device that comprises:
a plurality of first access transistors and a plurality of second access transistors, each access transistor having a gate electrode and an active area, the active area being formed within a semiconductor substrate;
each active area comprising a bit line contact section, a node contact section and a channel section, the bit line contact section and the node contact section being adjacent to a pattern surface of the substrate and the channel section separating the bit line contact section and the node contact section; and
each gate electrode being disposed at least in part in a recess groove formed in the substrate between the respective node contact section and the respective bit line contact section, and each gate electrode being separated from the respective channel section by a gate dielectric;
the semiconductor memory device further comprising:
a plurality of isolation transistors, each isolation transistor being arranged between a pair of one of the first and one of the second access transistors, the first and the second access transistors facing laterally reversed and opposing the isolation transistor, the node contact section of the first access transistor and the node contact section of the second access transistor being adjacent to the isolation transistor;
a plurality of isolation gate lines of the isolation transistors being separated from the substrate by an isolation gate dielectric layers and being disposed at least in parts in isolation grooves, the isolation grooves being formed in the substrate between the node contact sections of the first and the second access transistors;
wherein a plurality of the access transistors are arranged in lines such that the bit line contact sections of neighboring first and second access transistors form a common bit line contact section and such that the active areas of the access transistors form a contiguous semiconductor line.

14. The integrated circuit of claim 13, wherein the gate electrodes are disposed in part above the pattern surface.

15. The integrated circuit of claim 13, further comprising a plurality of bit lines, wherein each bit line is coupled to contact sections associated with one of the semiconductor lines respectively and sections of the bit line run alternately on opposing sides of the respective semiconductor line.

16. The integrated circuit of claim 13, further comprising a plurality of word lines forming in sections gate electrodes of said plurality of access transistors that are arranged essentially perpendicularly to the semiconductor lines, wherein the word lines are buried completely below the pattern surface.

17. The integrated circuit of claim 1, wherein the gate electrodes are disposed in part above the pattern surface.

* * * * *